United States Patent [19]
Grandfield et al.

[11] Patent Number: 5,564,092
[45] Date of Patent: Oct. 8, 1996

[54] DIFFERENTIAL FEED-FORWARD AMPLIFIER POWER CONTROL FOR A RADIO RECEIVER SYSTEM

[75] Inventors: Walter Grandfield, Lake Worth; Vance H. Peterson, Boca Raton, both of Fla.

[73] Assignee: Motorola, Inc., Schaumburg, Ill.

[21] Appl. No.: 334,092

[22] Filed: Nov. 4, 1994

[51] Int. Cl.$^6$ ............................. H04B 1/06; H04B 7/00
[52] U.S. Cl. ................... 455/232.1; 455/234.1; 455/235.1; 455/250.1; 455/226.2; 330/136
[58] Field of Search ................... 455/232.1, 226.2, 455/234.1, 235.1, 247.1, 250.1, 38.3, 343; 340/825.44, 311; 330/134, 136, 279, 129

[56] References Cited

U.S. PATENT DOCUMENTS

| | | | |
|---|---|---|---|
| 3,918,003 | 11/1975 | Seidel | 330/145 |
| 4,169,219 | 9/1979 | Beard | 455/235.1 |
| 4,811,423 | 3/1989 | Eastmond | 455/235.1 |
| 5,001,776 | 3/1991 | Clark | 455/226 |
| 5,208,549 | 5/1993 | Andoh | 330/136 |
| 5,359,607 | 10/1994 | Nguyen et al. | 455/226.1 |
| 5,369,799 | 11/1994 | Tsunoda | 455/234.1 |

Primary Examiner—Reinhard J. Eisenzopf
Assistant Examiner—Gertrude Arthur
Attorney, Agent, or Firm—Gregg Rasor

[57] ABSTRACT

A selective call receiver (100) includes a radio frequency amplifier (202) having an output power level that is controllable. A radio frequency level sensor (500) generates a sensor output signal in response to an input signal level received at the radio frequency amplifier (202). The sensor output signal is conditioned by a filter (401, 402) to generate a control signal representing an effective value of the input signal level received at the radio frequency amplifier (202). The control signal is then coupled to an amplifier output power level adjustment circuit (403) that operates to adjust a power gain of the radio frequency amplifier (202) in an unconditionally stable feed-forward manner such that the output power level remains substantially constant when the input signal level sensed by the radio frequency level sensor (500) substantially reaches or exceeds a predetermined signal overload level.

18 Claims, 5 Drawing Sheets

DIFFERENTIAL FEED-FORWARD AMPLIFIER POWER CONTROL FOR A RADIO RECEIVER SYSTEM

FIELD OF THE INVENTION

This invention relates in general to amplifier power control circuits and more particularly to an amplifier power control circuit for use in conjunction with a radio frequency amplifier in a selective call receiver.

BACKGROUND OF THE INVENTION

Conventional selective call receivers operate to receive radio frequency signals using a radio frequency amplifier that is typically tuned for optimal performance over a narrow operating frequency band. In order to maintain certain objectives such as battery life and profitability, a manufacturer will typically impose power and cost constraints that result in performance trade-offs.

As an example of a performance trade-off necessary in low power receiver design, a designer, given the goal of optimizing a radio frequency amplifier for low power consumption and good sensitivity over a relatively narrow frequency band, might choose to sacrifice dynamic range or intermodulation distortion characteristics. This choice would possibly lead to an amplifier having poor distortion characteristics at high input signal levels. Given that most conventional low power radio frequency amplifiers are of either a common emitter neutralized or a cascode topology, each of limited dynamic range, the choice of improving sensitivity by several decibels over a similar improvement in distortion characteristics would probably be a wise one. The preceding choice can be justified since the aforementioned topologies are well suited for amplifying a desired signal in environments where interfering signal levels are substantially below a desired signal level. However, in an environment where in addition to the desired signal, undesired narrow or broadband interference is impressed upon the amplifier, the desired signal will not be adequately amplified, thus degrading the receiver's sensitivity.

The degradation in sensitivity previously mentioned is due to the amplifier responding to the undesired signals falling within its operating bandwidth. More particularly, any number of signals falling within the operating bandwidth of an amplifier of finite dynamic range will cause the amplifier to generate an amplified response. The amplified response will correspond substantially in proportion with each of the input signals, but only to the point where the amplifier has sufficient power to respond in a linear fashion to said signals. When the amplifier becomes overloaded with respect to the desired signal, the result is a distorted amplified output signal. Essentially, a portion of the total energy available for amplification of the desired signal is "consumed" by the amplifier when it responds to amplify any interfering signals. In an ideal amplifier, this problem never occurs, but when constrained as discussed before, a designer will be eternally confronted with the choice between designing an amplifier having high gain, low noise figure, and poor high level distortion performance; or an amplifier having low gain, medium noise figure, and improved high level distortion performance.

Thus, what is needed is an apparatus, that in conjunction with a radio frequency receiver and amplifier, yields a receiving system having a relatively constant receiver sensitivity over widely varying interfering signal conditions. Moreover, the apparatus must operate in a power conserving mode while maintaining an amplified signal gain appropriate for the impressed signal conditions. As a result of controlling the signal gain, the distortion characteristics of the radio frequency receiver and amplifier are improved.

SUMMARY OF THE INVENTION

Briefly, according to the invention, there is provided a selective call receiver including a radio frequency amplifier having an output power level that is controllable. A radio frequency level sensor generates a sensor output signal in response to an input signal level received at the radio frequency amplifier. The sensor output signal is conditioned by a filter to generate a control signal representing an effective value of the input signal level received at the radio frequency amplifier. The control signal is then coupled to an amplifier output power level adjustment circuit that operates to adjust a power gain of the radio frequency amplifier in an unconditionally stable feed-forward manner such that the output power level remains substantially constant when the input signal level sensed by the radio frequency level sensor substantially reaches or exceeds a predetermined signal overload level.

DESCRIPTION OF A PREFERRED EMBODIMENT

Figure 1:
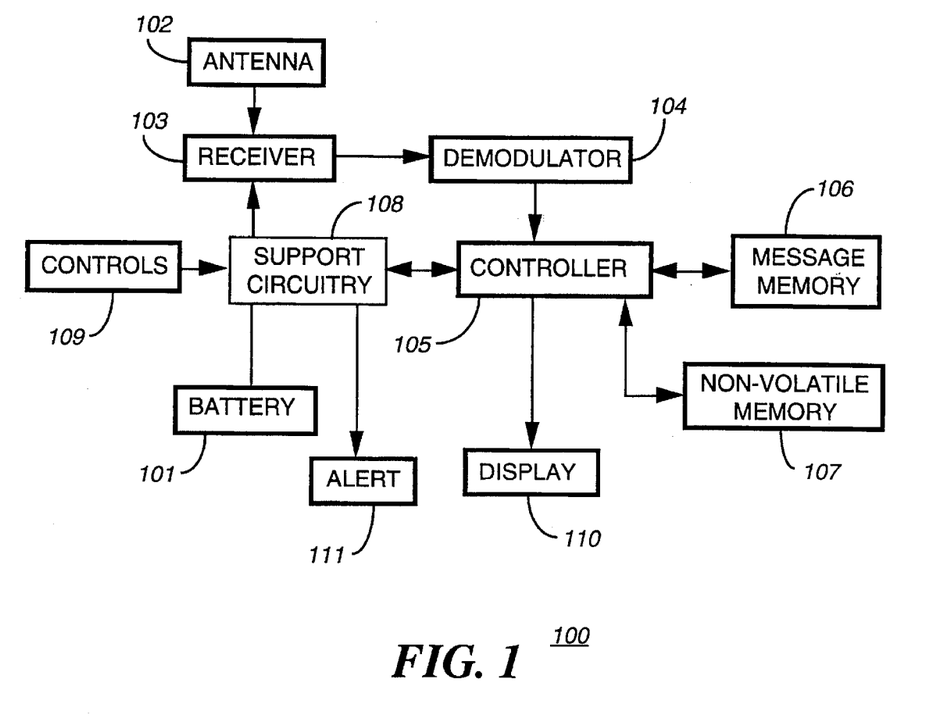
FIG. 1 is a block diagram of a selective call receiver suitable for use with the present invention.

Referring to FIG. 1, a battery 101 powered selective call receiver operates to receive a signal via an antenna 102. A receiver 103 couples a received signal to a demodulator 104, which recovers any information present using conventional techniques. The recovered information signal is coupled to a controller 105 that interprets and decodes the information contained therein. In the preferred embodiment, the controller 105 comprises a microprocessor having a signal processor (e.g., a decoder) implemented in both hardware and software.

The recovered information is checked by the decoder, which implements the signal processor for correlating a recovered address with a predetermined address. The nonvolatile memory 107 typically has a plurality of registers for storing the predetermined address and a plurality of configuration words that characterize the operation of the selective call receiver. In determining the selection of the selective call receiver, a correlation is performed between a recovered address contained within the information signal with a predetermined address corresponding to the selective call receiver. When the addresses substantially correlate, a detect is generated indicating selection of the selective call receiver and the controller 105 couples decoded message information to the message memory 106. In accordance with the recovered information, settings associated with the user controls 109, and detection, the support circuit 108 operates to process at least a portion of the message information for presentation, such as by a display 110, and may signal the user via an audible or tactile alert 111 that a message has been received. The user may view the information presented on the display 110 by activating the appropriate controls 109.

The support circuit 108 preferably comprises a conventional signal multiplexing integrated circuit, a voltage regulator that may supply a regulated voltage to portions of the support circuit 108, receiver 103, demodulator 104, or other selective call receiver components. Alternatively, the support circuit may be integrally coupled with the controller (e.g., a microcontroller includes features such as A/D, D/A converters, programmable I/O ports, a control buss, etc.). Furthermore, the support circuit 108 may include environmental sensing circuitry such as for light or temperature conditions, audio power amplifier circuitry, control interface circuitry, a clock frequency synthesizer, and display illumination circuitry. These elements are conventionally assembled to provide the information display receiver as requested by a customer.

Figure 2:
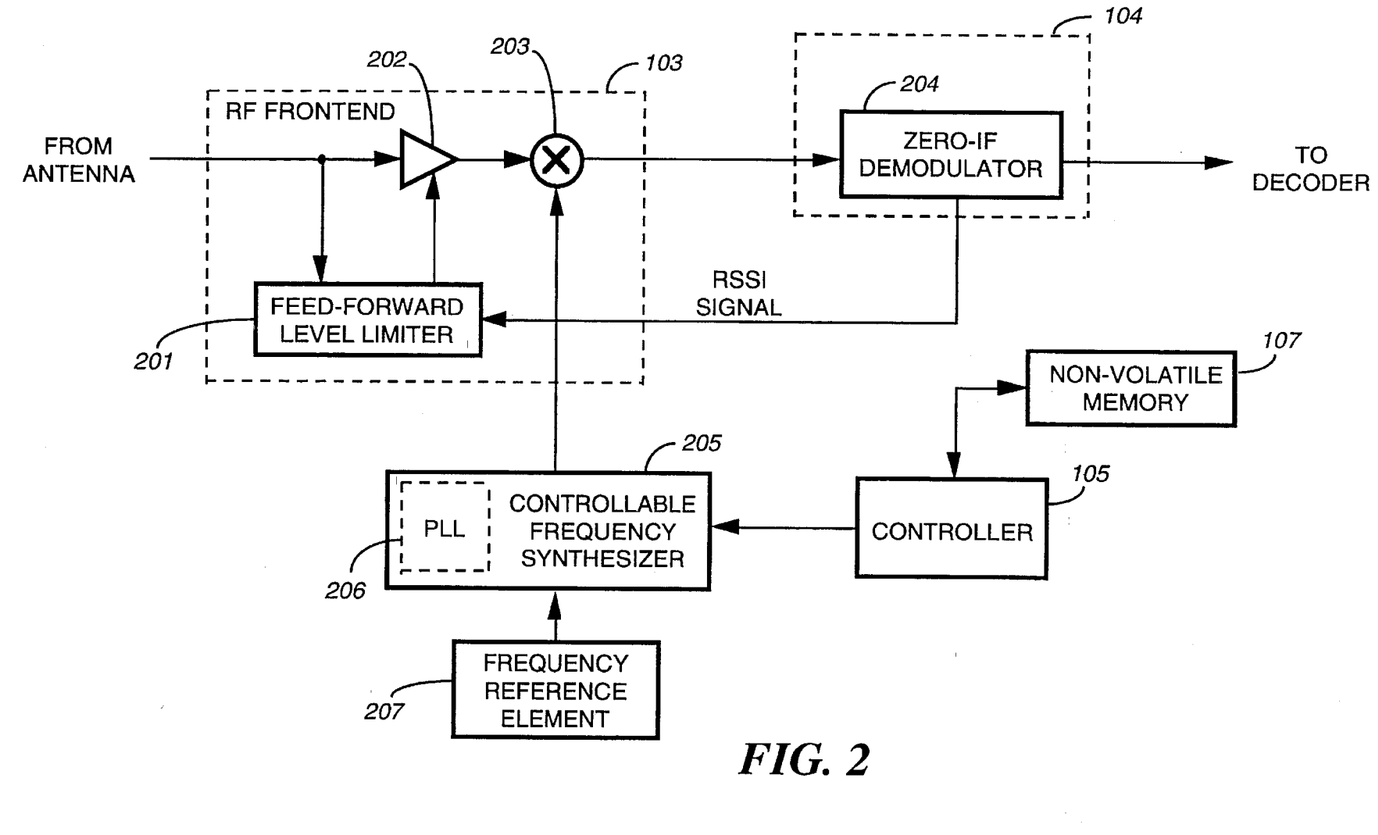
FIG. 2 is a partial block diagram of the selective call receiver depicted in FIG. 1 implementing a zero-IF receiver in accordance with the preferred embodiment of the present invention.

Referring to FIG. 2, the partial block diagram illustrates a zero-IF receiver implemented in the selective call receiver depicted in FIG. 1, in accordance with a first embodiment of the present invention.

A received signal is coupled from the antenna 102 to an RF amplifier 202. The RF amplifier 202 has a controllable output power that is determined at least in part by a detected amplitude associated with the received signal. In response to the detected amplitude exceeding a predetermined amplitude, a feed-forward level limiter 201 couples a control signal to the RF amplifier 202, thereby adjusting the controllable output power of the RF amplifier 202 and preventing distortion due to high input signal levels. The predetermined amplitude should be chosen such that the desired signal is amplified with a signal to noise or carrier to noise (noise meaning any unwanted or undesired signals) ratio yielding a signal quality acceptable to accomplish conventional, error free decoding of wired of wireless signalling schemes. In this fashion, the received signal, which may include a modulated carrier signal, will be cleanly amplified and in good condition for later decoding.

After initial amplification, the received signal is converted down to baseband using a conventional frequency converter 203. The resulting baseband signal is subsequently demodulated using a conventional zero-if demodulator 204 such as a differentiate and cross-multiply topology or the like. The conversion is accomplished by mixing the received signal with a local oscillator signal provided by a controllable frequency synthesizer 205 or a conventional crystal controlled oscillator (not shown). In the preferred embodiment, the controllable frequency synthesizer 205 comprises a programmable phase lock loop synthesizer 206, using for example, at least one of a conventional divide-by-N prescaler, a dual modulus divider, or a fractional N division scheme such that the local oscillator signal frequency may be stepped in coarse or fine increments. The controllable frequency synthesizer 205 may also be used to synthesize any number of frequencies required to clock digital logic circuitry associated with other of the components comprising the selective call receiver (e.g., the decoder).

The controllable frequency synthesizer 205 is responsive to a controller module (e.g., an MC68HC05C4 manufactured by Motorola, Inc.) 105, that performs a sequence of decisions and controlling actions, as will be subsequently more fully discussed. The controller module 105 adjusts the local oscillator signal frequency by writing a control word (e.g., a divide factor) into the controllable frequency synthesizer 205, thereby programming the phase-locked loop 206 to a target frequency. The control word is derived from a relation between the frequency reference element 207 and the desired output frequency. The relation may be predetermined and its parameters stored in the non-volatile memory 107. The non-volatile memory 107 may then be accessed by the controller 105 to program an output frequency of the programmable phase lock loop synthesizer 206.

As a further example, consider the case where a secondary (undesired) radio frequency signal is received by the antenna 102 and impressed on the RF amplifier 202 along with a desired signal. In this case, high level or intermodulation distortion (IMD) may result. The preceding terms for distortion, even though different, are used interchangeably to illustrate the following problems of dealing with amplifier related nonlinear distortion. Since the level of IMD produced by a device is strongly related to the non-linearities associated with the device, and reducing the gain typically linearizes the operation of the device, IMD can be controlled by detecting both the input level (at the input of the RF amp 202), and output level (at the output of the RF amp 202), and possibly an intermediate frequency (IF) relative level indication of a received signal. In response to detecting one of these levels, the gain of the RF amplifier is adjusted to achieve and maintain substantially linear operation thereof in amplifying the desired signal. In the case of an active device such as an amplifier, reducing the input level of the unwanted signal typically results in a corresponding decrease in the distortion present in the desired received signal.

The instant invention is particularly well suited for minimizing distortion while operating in the feed-forward adjustment mode. By adjusting the output power of the RF amplifier 202 in response to the detected amplitude associated with the received signal present at its input, feed-forward adjustment is accomplished in an unconditionally stable manner. This operation greatly reduces the complexity associated with prior art gain control systems such as those operating with either positive or negative feedback, since no compensation is required to achieve stability in the instant invention.

Any number of methods can be applied to reduce the level of the unwanted signal presented to the receiver 103. An alternative method for controlling distortion in a conversion section such as the baseband converter is disclosed in U.S. Pat. No. 5,001,776 entitled: "COMMUNICATION SYSTEM WITH ADAPTIVE TRANSCEIVERS TO CONTROL INTERMODULATION DISTORTION", issued to Edward T. Clark and assigned to Motorola, Inc., the teachings of which are hereby incorporated by reference. This United States Patent discusses in a first embodiment, an apparatus that measures a quality of a received signal. In response to the quality being less than a predetermined quality factor, an adjustment is made in the drive level of a local oscillator signal that is used for effecting a conversion of a radio frequency signal from a first frequency to a second frequency. The Clark patent further discusses an optional control mechanism that regulates the gain of a radio frequency amplifier to prevent signal overload. Further, Clark discusses the exchange of coded responses that control a transmission power of a unit sending the radio frequency signal. In a second embodiment, Clark discusses an RSSI detector that determines a relative signal strength of the received signal. A controller then adapts the radio frequency amplifier's gain and local oscillator drive level in response to the detected signal quality and the relative signal strength.

As can be appreciated by one of ordinary skill in the art, the methods and apparatus disclosed in Clark may be further improved by adding the advantages of the instant invention.

Figure 3:
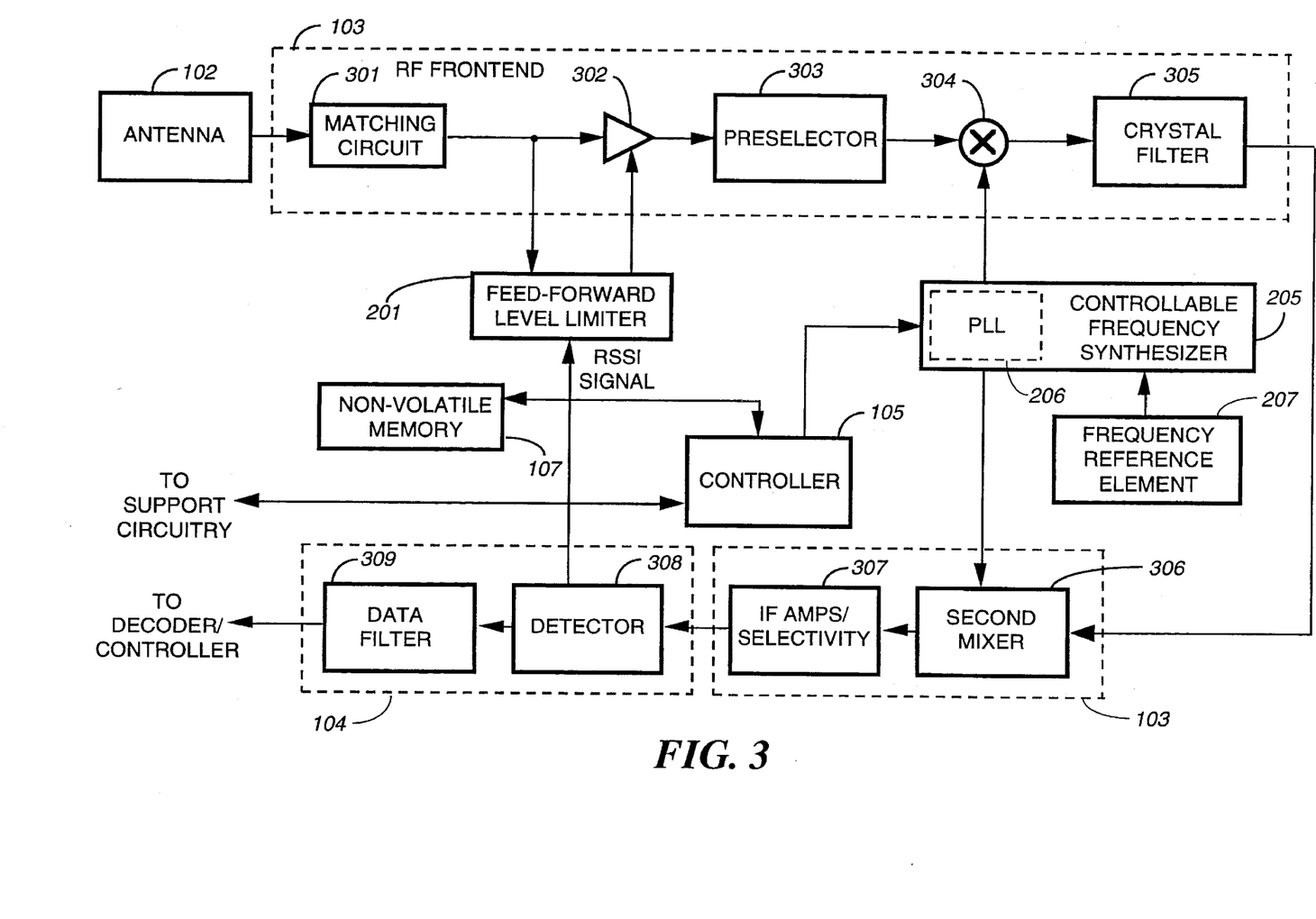
FIG. 3 is a partial block diagram of the selective call receiver depicted in FIG. 1 implementing a dual conversion receiver in accordance with a second embodiment of the invention.

Referring to FIG. 3, the partial block diagram illustrates a frequency synthesized dual conversion receiver implemented in the selective call receiver depicted in FIG. 1, in accordance with a second embodiment of the invention.

A received signal is coupled from the antenna 102 to an RF amplifier 302 via a matching circuit 301. The RF amplifier 302 has a controllable output power that is determined at least in part by a detected amplitude associated with the received signal. In response to the detected amplitude exceeding a predetermined amplitude, a feed-forward level limiter 201 couples a control signal to the RF amplifier 302, thereby adjusting the controllable output power of the RF amplifier 302 and preventing distortion due to high input signal levels. As with the example in FIG. 2, the predetermined amplitude should be chosen such that the desired signal is amplified with a signal to noise or carrier to noise (noise meaning any unwanted or undesired signals) ratio yielding a signal quality acceptable to accomplish conventional, error free decoding of wired of wireless signalling schemes. In this fashion, the received signal, which may include a modulated carrier signal, will be cleanly amplified and in good condition for later decoding.

This exemplary dual-conversion receiver "RF front end" 301, 302, 303, 304, 305 is responsive to a transmitted signal that is received and coupled in via an antenna 102, as is commonly known in the art. The received signal from the antenna 102 may be optionally preconditioned using known techniques to provide an optimum signal level within a predetermined frequency bandwidth that is coupled to a first mixer 304.

The optional preconditioning of the received signal is usually performed by a matching circuit 301, a radio frequency amplifier 302, and a preselector filtering circuit 303, the design and function of these circuits being generally well known in the art. The matching circuit 301 matches the antenna 102 impedance characteristics to the RF amplifier 302. Preferably, the matching circuit is designed to provide the RF amplifier 302 with an optimum noise match (minimum noise figure) and low insertion loss, thereby optimally delivering the received signal power from the antenna 102 to the RF amplifier 302. The amplified signal is then be coupled to a preselector filtering circuit 303 that accepts a desired signal with minimal attenuation (e.g., within a predetermined frequency band) and attenuates (i.e., rejects) all undesired signals. Consequently, the received signal is preconditioned and coupled to the first signal mixer 304.

The first mixer 304 subsequently mixes the preconditioned received signal with a first local oscillator injection signal provided by the controllable frequency synthesizer 203. The controllable frequency synthesizer has an output frequency derived from the frequency reference element 207. The resulting conversion generates a first intermediate frequency signal that is subsequently coupled to a crystal filter 305 that passes the first intermediate frequency signal and attenuates any undesired signals such as the first mixer image signal and the first local oscillator injection signal.

A second mixer 306 mixes the first intermediate frequency signal with a second local oscillator injection signal provided by the controllable frequency synthesizer 205. The resulting second intermediate frequency signal is typically filtered and amplified (i.e., by an intermediate frequency amplifying and filtering circuit 307) and coupled to the demodulator 104. The demodulator in this embodiment comprises a modulation detector 308 that recovers information (i.e., FSK digital data, audio tones, PSK digital data, SSB, etc.) that is coupled to a decoder via a data filter 309 in a manner well known in the art.

In performing frequency selection, the controller 105 is coupled to the controllable frequency synthesizer 205 including the phase lock loop 206. The controller operates to execute a microcode program that generates a frequency control signal. The frequency control signal serves to program the output frequency of the controllable frequency synthesizer 205 to reflect a frequency error of substantially zero parts per million with respect to a desired operating frequency (e.g., the local oscillator frequency, clock frequency, or the like).

The non-volatile ram (e.g., read only memory, backed-up random access memory, EEPROM, or the like) 107 may provide storage for executable controller instructions, storage for a table representing programmed output frequencies and their corresponding control word(s) (e.g., divide factors), and storage for non-volatile configuration information that may be necessary to perform the decisions and actions in the control process, as will be subsequently more fully discussed.

Figure 4:
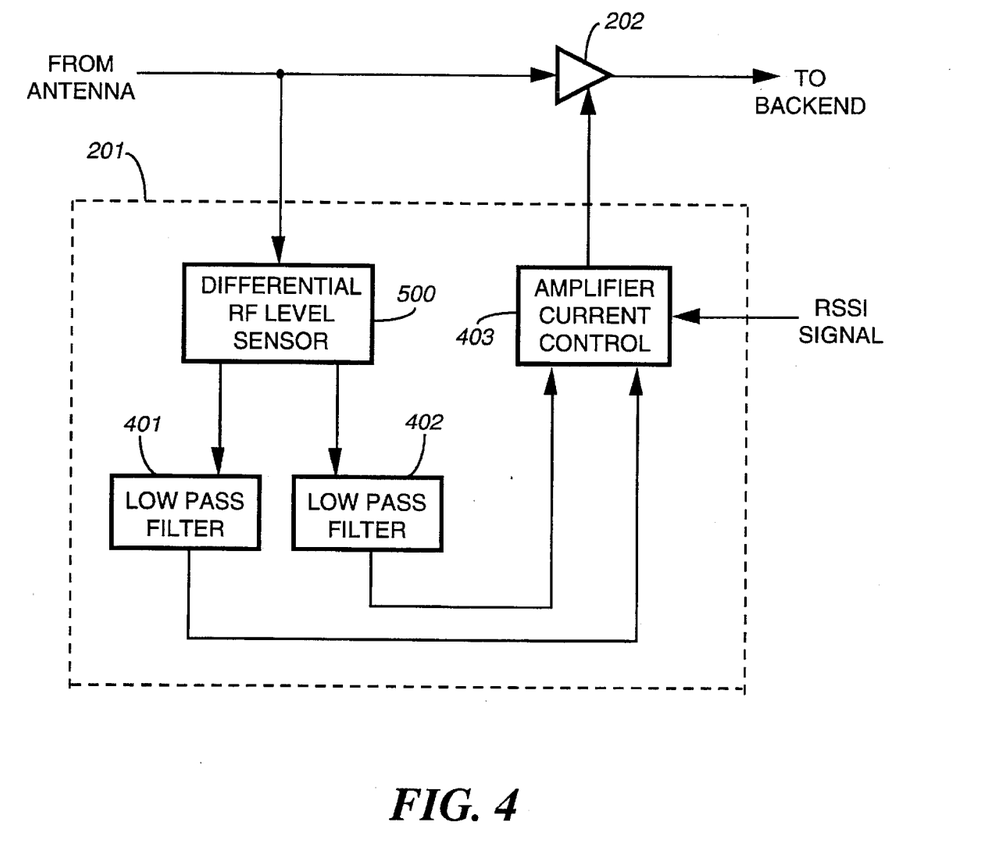
FIG. 4 is a block diagram of a radio frequency amplifier having an output power level that is controllable in accordance with the preferred embodiment of the present invention.

Referring to FIG. 4, the block diagram illustrates a radio frequency amplifier having an output power level that is controllable in accordance with the preferred embodiment of the present invention.

When the signal strength from the antenna 102 is below the predetermined signal overload level of the receiver, the differential output of the RF level sensor 500 will not reduce the current consumption of the RF amplifier 202. When the signal strength from the antenna exceeds the overload level the differential output of the RF level sensor 500 will change to its alternate asymmetric state. In this state the current consumption and hence the power gain of the RF amplifier 202 is reduced as the antenna signal strength increases. As a result the output power of the RF amplifier 202 will remain relatively constant.

The low pass filters 401, 402 operate to substantially remove any AC signal components and pass the DC signal component of the RF level sensor 500 output. Operation as such prevents the difference component of two closely spaced frequencies from reaching the amplifier current control 403 and amplitude modulating the RF amplifier 202.

The amplifier current control circuit 403 is implemented using a suitable conventional differential buffer/amplifier or the like. The function of the amplifier current control circuit 403 is in response to the DC value detected and filtered by the RF level sensor 500 and low pass filters 401, 402, controlling the power gain of the RF amplifier 202 by regulating the amount of current available to the RF amplifier 202 as a function of detected signal strength.

Operationally, the RF voltage at which the differential RF level sensor 500 switches asymmetric states is extremely repeatable. Since the switching threshold is substantially determined by the area ratio of the transistors used to fabricate the differential level sensor, even when the integrated circuit process used to fabricate the components varies, the detection threshold associated with the predetermined amplitude will remain substantially constant and unchanged. Furthermore, since a differential signal is used to control the current and resulting output power of the RF amplifier 202, better repeatability is insured over process and temperature variations.

Figure 5:
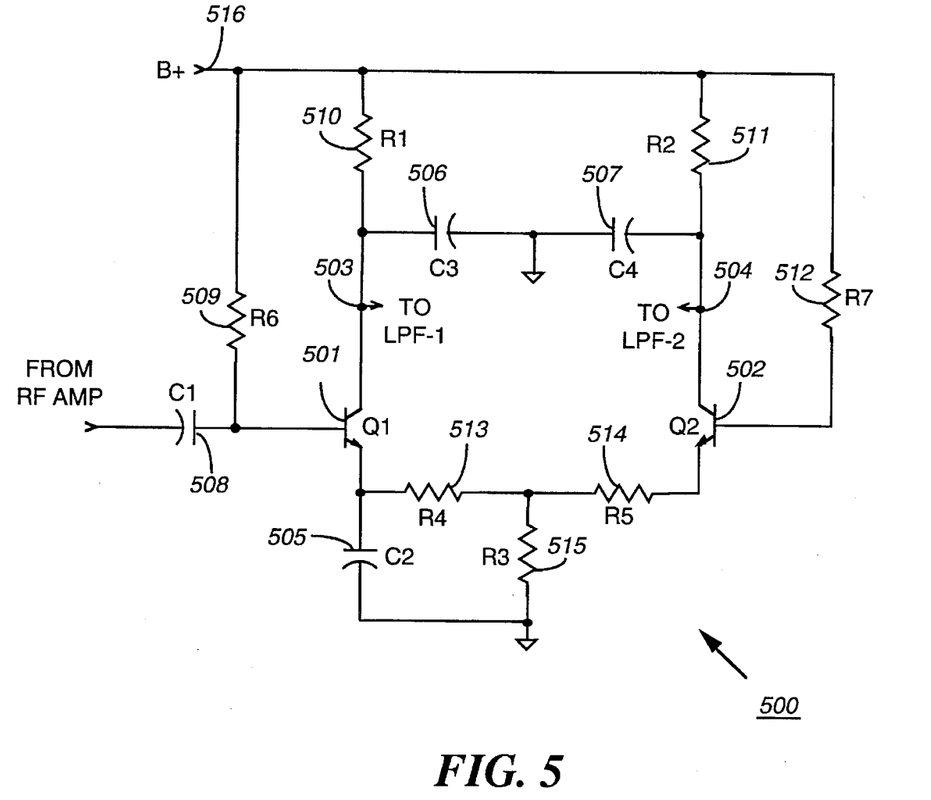
FIG. 5 is a simplified schematic diagram of a radio frequency level sensor for use with the radio frequency amplifier in accordance with the preferred embodiment of the present invention.

Referring to FIG. 5, the simplified schematic diagram illustrates a radio frequency level sensor for use with the radio frequency amplifier in accordance with the preferred embodiment of the present invention.

The differential RF level sensor 500 is essentially an asymmetrically biased differential amplifier. The area factor of $Q_2$ 501 is designed as being larger than that of $Q_1$ 502. Hence, with no RF voltage present at the base of $Q_1$ 502, terminal LPF-1 503 will be at a higher voltage than terminal LPF-2 504. As the RF voltage at the base of $Q_1$ 502 is increased, the collector current of $Q_1$ 502 will increase due to the "delta current" phenomena. Delta current, which is commonly expressed as a percentage, is the difference between the quiescent DC operating current in each amplifying stage and the operating current with RF impressed upon the stage. The increase in operating current is primarily due to the rectifying and filtering effects of the active device when RF is impressed, e.g., a bipolar transistor has a diode, resistance, and capacitance associated with the device that together function like a circuit that detects an average value of the RF energy as a DC value. Consequently, an effective RF voltage is detected by generating an effective DC value.

The RF voltage necessary to make the collector current of $Q_1$ 502 equal to the collector current of $Q_2$ 501 is determined by the area factor difference between $Q_2$ 501 and $Q_1$ 502. Hence, the larger $Q_2$ 501 is compared to $Q_1$ 502, the larger the RF voltage necessary at the base of $Q_1$ 502 to achieve equal collector currents. As the RF voltage is increased further, the collector current of $Q_1$ 502 will exceed that of $Q_2$ 501 resulting in LPF-2 504 being at a higher potential than LPF-1 503. The resulting differential voltage ($V_{LPF-2}$, $V_{LPF-1}$) is then used to control the gain of the RF amplifier by coupling the filtered differential voltages to the amplifier current control circuit 403.

Concerning the quiescent DC operating point of the differential RF level sensor 500, a supply voltage of substantially one volt DC 516 powers the circuit. Resistors $R_1$ 510, $R_2$ 511, $R_3$ 515, $R_4$ 513, $R_5$ 514, $R_6$ 509, and $R_7$ 512 operate to set the steady state DC bias for proper operation. As with a symmetric differential amplifier, the right and left half components essentially mirror each other's values. In the instant case, this is true for all components except for the transistors, $Q_1$ 502 and $Q_2$ 501, as discussed before. Capacitor $C_1$ operates as an AC coupling impedance to allow detection of the input signal level received at the radio frequency amplifier 202. Capacitor $C_2$ operates as an RF bypass capacitor, making the performance of the RF level sensor 500 substantially independent of frequency. Capacitors $C_3$ and $C_4$ operate as AC shorts, thus insuring that the RF level sensor has little or no gain at RF frequencies. These capacitors also serve to increase the input impedance of $Q_1$ 502, so as not to load down the antenna 102.

In summary, the invention described herein is preferably embodied in a selective call receiver such as illustrated in FIG. 1 including a radio frequency amplifier 202, 302 having an output power level that is controllable. A radio frequency level sensor 500 operates to generates a sensor output signal in response to an input signal level received at the radio frequency amplifier 202, 302. The sensor output signal has a spectral content comprising complex periodic and non-periodic components. This signal is then coupled to at least one filter 401, 402, such as a low pass filter that operates to condition it such that a filter output or control signal is generated representing an effective value of the received input signal level present at the radio frequency amplifier. The control signal is then coupled to an amplifier output power level adjustment circuit 403 that operates to adjust a power gain of the radio frequency amplifier 202, 302 in an unconditionally stable feed-forward manner such that the output power level remains substantially constant when a received input signal level sensed by the radio frequency level sensor 500 substantially reaches or exceeds a predetermined signal overload level.

More specifically, the radio frequency level sensor 500 includes a single ended input, differential output amplifier having differential halves. The radio frequency level sensor operates in a first state when the received input signal level coupled from the radio frequency amplifier 202, 302 is below the predetermined signal overload level such that the differential halves are biased in a first asymmetric direction resulting in no adjustment of the output power level, thus allowing the output power level to substantially track the received input signal level; and in a second state when the received input signal level substantially reaches or exceeds the predetermined signal overload level such that the differential halves are biased in a second asymmetric direction resulting in a differential output signal that effects adjustment of the power gain of the radio frequency amplifier to maintain a substantially constant radio frequency amplifier output power level. Moreover, the amplifier output power level adjustment circuit 403 may be further responsive to a relative strength indication of a received on-channel signal (shown as an RSSI signal in FIGS. 2, 3 and 4), the amplifier output power level adjustment circuit operating to adjust the power gain of the radio frequency amplifier 202, 302 such that the output power level remains substantially constant when the received on-channel signal substantially reaches or exceeds a predetermined signal overload level.

Finally, for matters of convenience, the radio frequency amplifier 202, 302, the radio frequency level sensor 500, the at least one filter 401, 402, and the amplifier output power level adjustment circuit 403 are fabricated in a single integrated circuit.

As may be discerned by one of ordinary skill in the art, minor variations from the disclosed invention are possible that would allow one to achieve the same end using a different means. Examples of such variations would be integrating only a portion of the disclosed circuit in a single integrated circuit chip, or purposefully separating certain components due to design of practical considerations such as radio frequency interference of the like. Moreover, the receiving, demodulating, and decoding techniques illustrated are exemplary in nature and should in no way be taken to preclude the inclusion of techniques such as non-conventional modulation and signalling schemes like spread spectrum, or the use of digital selectivity, detection, and decoding methods.

We claim:

1. A selective call receiver including a radio frequency amplifier having an output power level that is controllable, the selective call receiver comprising:

a radio frequency level sensor that generates a sensor output signal in response to an input signal level received at the input of the radio frequency amplifier;

at least one filter coupled to the radio frequency level sensor, the at least one filter operating to condition the sensor output signal having a spectral content comprising complex periodic and non-periodic components such that a filter output signal is generated representing an effective value of the input signal level received at the radio frequency amplifier; and an amplifier output power level adjustment circuit responsive to the filter output signal, the amplifier output power level adjustment circuit operating to adjust a power gain of the radio frequency amplifier in an unconditionally stable feed-forward manner such that the output power level remains substantially constant when a received input signal level sensed by the radio frequency level sensor substantially reaches or exceeds a predetermined signal overload level.

2. The selective call receiver according to claim 1 wherein the radio frequency level sensor comprises:

a single ended input, differential output amplifier having differential halves, the radio frequency level sensor operating:

in a first state when the input signal level received at the radio frequency amplifier is below the predetermined signal overload level such that the differential halves are biased in a first asymmetric direction resulting in no adjustment of the output power level, thus allowing the output power level to substantially track the received input signal level; and in a second state when the input signal level received at the radio frequency amplifier substantially reaches or exceeds the predetermined signal overload level such that the differential halves are biased in a second asymmetric direction resulting in a differential output signal that effects adjustment of the power gain of the radio frequency amplifier to maintain a substantially constant radio frequency amplifier output power level.

3. The selective call receiver according to claim 1 wherein the amplifier output power level adjustment circuit is further responsive to a relative strength indication of a received on-channel signal, the amplifier output power level adjustment circuit operating to adjust the power gain of the radio frequency amplifier such that the output power level remains substantially constant when the received on-channel signal substantially reaches or exceeds a predetermined signal overload level.

4. The selective call receiver according to claim 1 wherein the at least one filter comprises a low-pass filter.

5. The selective call receiver according to claim 1 wherein the radio frequency amplifier, the radio frequency level sensor, the at least one filter, and the amplifier output power level adjustment circuit are fabricated in an integrated circuit.

6. The selective call receiver according to claim 5 wherein the integrated circuit is fully operational when powered by a supply voltage of substantially one volt DC.

7. A selective call receiver, comprising:

a receiver including a radio frequency amplifier having an output power level that is controllable, the receiver operating to provide a received signal, the receiver comprising:

a radio frequency level sensor that generates a sensor output signal in response to an input signal level received at the input of the radio frequency amplifier;

at least one filter coupled to the radio frequency level sensor, the at least one filter operating to condition the sensor output signal having a spectral content comprising complex periodic and non-periodic components such that a filter output signal is generated representing an effective value of the input signal level received at the radio frequency amplifier; and an amplifier output power level adjustment circuit responsive to the filter output signal, the amplifier output power level adjustment circuit operating to adjust a power gain of the radio frequency amplifier in an unconditionally stable feed-forward manner such that the output power level remains substantially constant when the input signal level received at the radio frequency amplifier as sensed by the radio frequency level sensor substantially reaches or exceeds a predetermined signal overload level;

a demodulator for recovering the received signal and providing an information signal;

a decoder for correlating a recovered address contained within the information signal with a predetermined address corresponding to the selective call receiver, and responsive to said recovered and predetermined addresses substantially correlating, generating a detection indicating selection of the selective call receiver; and a support circuit to process information recovered from the information signal for presentation in response to the detection indicating selection of the selective call receiver.

8. The selective call receiver according to claim 7 wherein the radio frequency level sensor comprises:

a single ended input, differential output amplifier having differential halves, the radio frequency level sensor operating:

in a first state when the input signal level received at the radio frequency amplifier is below the predetermined signal overload level such that the differential halves are biased in a first asymmetric direction resulting in no adjustment of the output power level, thus allowing the output power level to substantially track a received input signal level; and in a second state when the input signal level received at the radio frequency amplifier substantially reaches or exceeds the predetermined signal overload level such that the differential halves are biased in a second asymmetric direction resulting in a differential output signal that effects adjustment of the power gain of the radio frequency amplifier to maintain a substantially constant radio frequency amplifier output power level.

9. The selective call receiver according to claim 7 wherein the at least one filter comprises a low-pass filter.

10. The selective call receiver according to claim 7 wherein the radio frequency amplifier, the radio frequency level sensor, the at least one filter, and the amplifier output power level adjustment circuit are fabricated in an integrated circuit.

11. The selective call receiver according to claim 10 wherein the integrated circuit is fully operational when powered by a supply voltage of substantially one volt DC.

12. A radio frequency amplifier system having an output power level that is controllable, comprising:

a radio frequency level sensor that generates a sensor output signal in response to an input signal level received at the input of the radio frequency amplifier;

at least one filter coupled to the radio frequency level sensor, the at least one filter operating to condition the sensor output signal having a spectral content comprising complex periodic and non-periodic components such that a filter output signal is generated representing an effective value of the input signal level received at the radio frequency amplifier; and an amplifier output power level adjustment circuit responsive to the filter output signal, the amplifier output power level adjustment circuit operating to adjust a power gain of the radio frequency amplifier in an unconditionally stable feed-forward manner such that the output power level remains substantially constant when a received input signal level sensed by the radio frequency level sensor substantially reaches or exceeds a predetermined signal overload level.

13. The radio frequency amplifier according to claim 12 wherein the radio frequency level sensor comprises:

a single ended input, differential output amplifier having differential halves, the radio frequency level sensor operating:

in a first state when the input signal level received at the radio frequency amplifier is below the predetermined signal overload level such that the differential halves are biased in a first asymmetric direction resulting in no adjustment of the output power level, thus allowing the output power level to substantially track the received input signal level; and in a second state when the input signal level received at the radio frequency amplifier substantially reaches or exceeds the predetermined signal overload level such that the differential halves are biased in a second asymmetric direction resulting in a differential output signal that effects adjustment of the power gain of the radio frequency amplifier to maintain a substantially constant radio frequency amplifier output power level.

14. The radio frequency amplifier according to claim 12 wherein the amplifier output power level adjustment circuit is further responsive to a relative strength indication of a received on-channel signal, the amplifier output power level adjustment circuit operating to adjust the power gain of the radio frequency amplifier such that the output power level remains substantially constant when the received on-channel signal substantially reaches or exceeds a predetermined signal overload level.

15. The radio frequency amplifier according to claim 12 wherein the at least one filter comprises a low-pass filter.

16. The radio frequency amplifier according to claim 12 wherein the radio frequency amplifier, the radio frequency level sensor, the at least one filter, and the amplifier output power level adjustment circuit are fabricated in an integrated circuit.

17. The radio frequency amplifier according to claim 16 wherein the integrated circuit is fully operational when powered by a supply voltage of substantially one volt DC.

18. The radio frequency amplifier according to claim 16 wherein the integrated circuit serves an a receiver for a selective call receiver.

\* \* \* \* \*